(12) United States Patent
Smeets et al.

(10) Patent No.: US 12,738,445 B2
(45) Date of Patent: Sep. 15, 2026

(54) BEAM POSITION DISPLACEMENT CORRECTION IN CHARGED PARTICLE INSPECTION

(71) Applicant: ASML Netherlands B.V., Veldhoven (NL)

(72) Inventors: Martin Frans Pierre Smeets, Veldhoven (NL); Niels Johannes Maria Bosch, Eindhoven (NL); Willem Petrus Van Aaken, Mierlo (NL); Jef Goossens, Bocholt (BE); Te-Yu Chen, San Jose, CA (US); Funda Sahin, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 251 days.

(21) Appl. No.: 18/714,936

(22) PCT Filed: Nov. 2, 2022

(86) PCT No.: PCT/EP2022/080549
§ 371 (c)(1),
(2) Date: May 30, 2024

(87) PCT Pub. No.: WO2023/099104
PCT Pub. Date: Jun. 8, 2023

(65) Prior Publication Data

US 2025/0037961 A1 Jan. 30, 2025

Related U.S. Application Data

(60) Provisional application No. 63/285,446, filed on Dec. 2, 2021.

(51) Int. Cl.
*H01J 37/15* (2006.01)
*H01J 37/14* (2006.01)
(Continued)

(52) U.S. Cl.
CPC ........ *H01J 37/153* (2013.01); *H01J 37/1471* (2013.01); *H01J 37/1475* (2013.01);
(Continued)

(58) Field of Classification Search
CPC .. H01J 37/153; H01J 37/1471; H01J 37/1475; H01J 37/20; H01J 2237/0209;
(Continued)

(56) References Cited

FOREIGN PATENT DOCUMENTS

| | | | | |
|---|---|---|---|---|
| CA | 2793696 A1 * | 10/2011 | .............. | C08J 3/245 |
| EP | 0307906 A1 | 3/1989 | | |

(Continued)

OTHER PUBLICATIONS

PCT International Search Report and Written Opinion issued in related PCT International Application No. PCT/EP2022/080549; mailed Feb. 23, 2023 (10 pages).

*Primary Examiner* — Nicole M Ippolito
(74) *Attorney, Agent, or Firm* — FINNEGAN, HENDERSON, FARABOW, GARRETT & DUNNER, LLP

(57) ABSTRACT

A method and system for correcting inspection image error are disclosed. The method includes acquiring a set of first beam positions on a test wafer while a wafer stage supporting the test wafer moves at a first velocity; acquiring a set of second beam positions, corresponding to the set of first beam positions, on the test wafer while the wafer stage moves at a second velocity; calculating a beam position displacement of a beam while the wafer stage moves at a third velocity in a range of velocities from the first velocity to the second velocity; and adjusting a beam position of the beam based on the calculated beam position displacement.

20 Claims, 12 Drawing Sheets

(51) Int. Cl.
*H01J 37/147* (2006.01)
*H01J 37/153* (2006.01)
*H01J 37/20* (2006.01)

(52) U.S. Cl.
CPC ....... *H01J 37/20* (2013.01); *H01J 2237/0209* (2013.01); *H01J 2237/1536* (2013.01); *H01J 2237/20221* (2013.01); *H01J 2237/24578* (2013.01)

(58) Field of Classification Search
CPC ..... H01J 2237/1536; H01J 2237/20221; H01J 2237/24578
See application file for complete search history.

(56) References Cited

FOREIGN PATENT DOCUMENTS

| | | | | |
|---|---|---|---|---|
| EP | 0452969 | A2 * | 10/1991 | .............. H01J 37/12 |
| TW | 200305934 | A | 11/2003 | |

* cited by examiner

700

| | $P_1$ | $P_2$ | • • • | Pn |
|---|---|---|---|---|
| $V_2$ | $D_{21}$ | $D_{22}$ | • • • | $D_{2n}$ |
| $V_3$ | $D_{31}$ | $D_{32}$ | • • • | $D_{3n}$ |

FIG. 7

BEAM POSITION DISPLACEMENT CORRECTION IN CHARGED PARTICLE INSPECTION

CROSS-REFERENCE TO RELATED APPLICATIONS

This application claims priority to PCT International Application No. PCT/EP2022/080549, filed 2 Nov. 2 2022, which claims priority of U.S. application 63/285,446, filed 2 Dec. 2021. The contents of these applications are incorporated herein by reference in their entireties.

TECHNICAL FIELD

The embodiments provided herein relate to an image enhancement technology, and more particularly to a beam position displacement calibration or correction for charged particle inspection.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more important. Inspection images such as SEM images can be used to identify or classify a defect(s) of the manufactured ICs. To improve defect detection performance, obtaining an accurate SEM image without distortion nor deformation is desired.

SUMMARY

The embodiments provided herein disclose a particle beam inspection apparatus, and more particularly, an inspection apparatus using a plurality of charged particle beams.

Some embodiments provide a method for correcting inspection image error. The method comprises acquiring a set of first beam positions on a test wafer while a wafer stage supporting the test wafer moves at a first velocity; acquiring a set of second beam positions, corresponding to the set of first beam positions, on the test wafer while the wafer stage moves at a second velocity; calculating a beam position displacement of a beam while the wafer stage moves at a third velocity in a range of velocities from the first velocity to the second velocity; and adjusting a beam position of the beam based on the calculated beam position displacement.

Some embodiments provide an apparatus for correcting inspection image error. The apparatus comprises: a memory storing a set of instructions, and at least one processor configured to execute the set of instructions to cause the apparatus to perform: acquiring a set of first beam positions on a test wafer while a wafer stage supporting the test wafer moves at a first velocity; acquiring a set of second beam positions, corresponding to the set of first beam positions, on the test wafer while the wafer stage moves at a second velocity; calculating a beam position displacement of a beam while the wafer stage moves at a third velocity in a range of velocities from the first velocity to the second velocity; and adjusting a beam position of the beam based on the calculated beam position displacement.

Other advantages of the embodiments of the present disclosure will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

FIG. 7 illustrates an example beam displacement table, consistent with some embodiments of the present disclosure.

DETAILED DESCRIPTION

Figure 1:
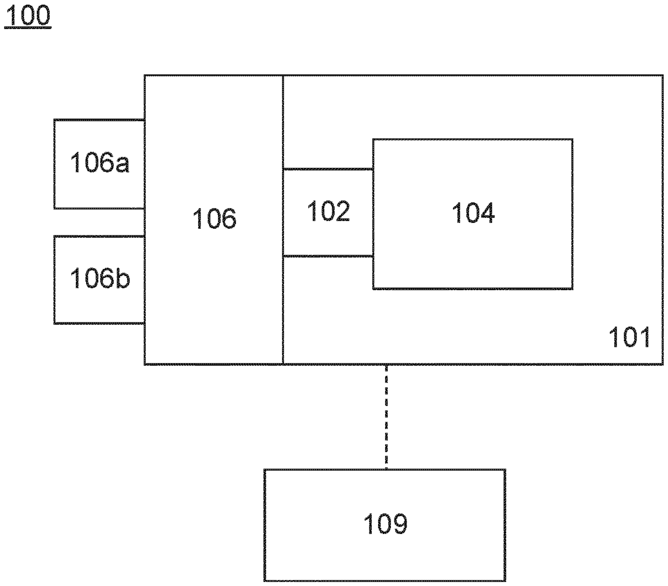
FIG. 1 is a schematic diagram illustrating an example charged-particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of semiconductor material called a substrate. The semiconductor material may include, for example, silicon, gallium arsenide, indium phosphide, or silicon germanium, or the like. Many circuits may be formed together on the same piece of silicon and are called integrated circuits or ICs. The size of these circuits has decreased dramatically so that many more of them can be fit on the substrate. For example, an IC chip in a smartphone can be as small as a thumbnail and yet may include over 2 billion transistors, the size of each transistor being less than 1/1000th the size of a human hair.

Making these ICs with extremely small structures or components is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process; that is, to improve the overall yield of the process.

One component of improving yield is monitoring the chip-making process to ensure that it is producing a sufficient number of functional integrated circuits. One way to monitor the process is to inspect the chip circuit structures at various stages of their formation. Inspection can be carried out using a scanning charged-particle microscope (SCPM). For example, an SCPM may be a scanning electron microscope (SEM). A SCPM can be used to image these extremely small structures, in effect, taking a "picture" of the structures of the wafer. The image can be used to determine if the structure was formed properly in the proper location. If the structure is defective, then the process can be adjusted, so the defect is less likely to recur.

As the physical sizes of IC components continue to shrink, accuracy and yield in defect detection become more important. Inspection images such as SEM images can be used to identify or classify a defect(s) of the manufactured ICs. To improve defect detection performance, obtaining an accurate SEM image without distortion nor deformation is desired. A system magnetic field is formed around or in a SEM tool during operation, and thus when a wafer stage including conductor(s) moves in the system magnetic field, eddy currents may be induced in the conductors. By the induced eddy currents, a magnetic field that disturbs the system magnetic field of the SEM tool can be generated. Such magnetic field disturbances may cause displacements of charged particle beams on a sample from targeted positions, which in turn may degrade image quality of resulting SEM images. In an effort to avoid eddy currents from being generated, a wafer stage with an eddy current suppression design has been developed. For example, a non-conductive plate with conductive coating can be utilized as a wafer holder of a wafer stage. However, such alternative design is usually pricy to manufacture and requires frequent maintenance. Moreover, a wafer holder including a conductive material coating may exacerbate arcing effects when conducting a high voltage inspection of a wafer.

Embodiments of the disclosure may provide a beam position displacement compensation or correction technique for SEM inspection. According to some embodiments of the present disclosure, eddy current effects can be offset. According to some embodiments of the present disclosure, a wafer stage having conductor(s) can still be utilized while suppressing or minimizing eddy current effects. According to some embodiments of the present disclosure, a beam position displacement from a target position can be corrected. According to some embodiments of the present disclosure, effects of a disturbance magnetic field can be offset. Embodiments of the disclosure may provide a beam position displacement compensation or correction method or system based on a linear relationship between a movement velocity of a conductor and eddy current density induced in the conductor.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1 illustrates an example electron beam inspection (EBI) system 100 consistent with embodiments of the present disclosure. EBI system 100 may be used for imaging. As shown in FIG. 1, EBI system 100 includes a main chamber 101, a load/lock chamber 102, a beam tool 104, and an equipment front end module (EFEM) 106. Beam tool 104 is located within main chamber 101. EFEM 106 includes a first loading port **106*a* and a second loading port 106*b*. EFEM 106 may include additional loading port(s). First loading port 106*a* and second loading port 106*b*** receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by beam tool 104. Beam tool 104 may be a single-beam system or a multi-beam system.

A controller 109 is electronically connected to beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application- Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes and data may include an operating system (OS) and one or more application programs (or "apps") for specific tasks. The memory may also be a virtual memory that includes one or more memories distributed across multiple machines or devices coupled via a network.

Figure 2:
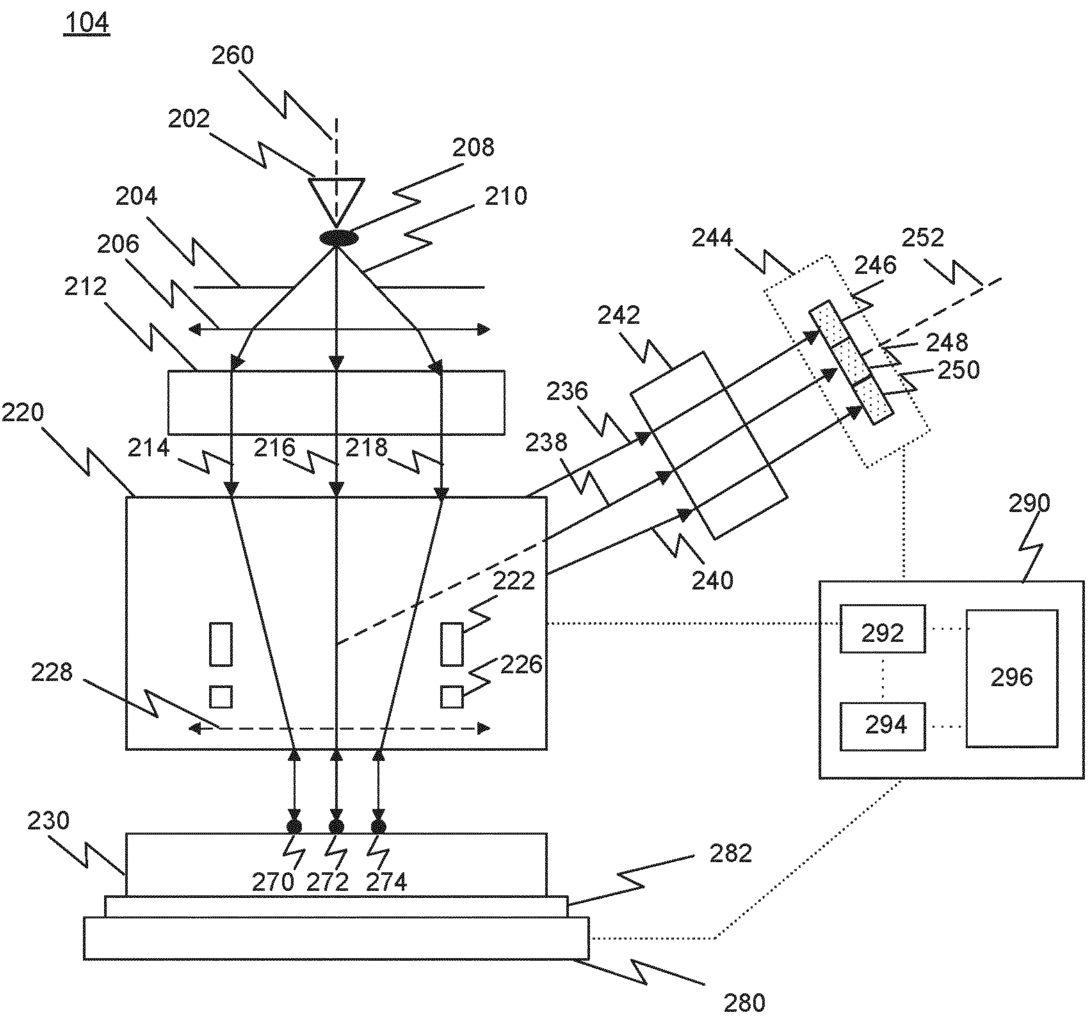
FIG. 2 is a schematic diagram illustrating an example multi-beam tool that can be a part of the example charged-particle beam inspection system of FIG. 1, consistent with embodiments of the present disclosure.

FIG. 2 illustrates a schematic diagram of an example multi-beam tool 104 (also referred to herein as apparatus 104) and an image processing system 290 that may be configured for use in EBI system 100 (FIG. 1), consistent with embodiments of the present disclosure.

Beam tool 104 comprises a charged-particle source 202, a gun aperture 204, a condenser lens 206, a primary charged-particle beam 210 emitted from charged-particle source 202, a source conversion unit 212, a plurality of beamlets 214, 216, and 218 of primary charged-particle beam 210, a primary projection optical system 220, a motorized wafer stage 280, a wafer holder 282, multiple secondary charged-particle beams 236, 238, and 240, a secondary optical system 242, and a charged-particle detection device 244. Primary projection optical system 220 can comprise a beam separator 222, a deflection scanning unit 226, and an objective lens 228. Charged-particle detection device 244 can comprise detection sub-regions 246, 248, and 250.

Charged-particle source 202, gun aperture 204, condenser lens 206, source conversion unit 212, beam separator 222, deflection scanning unit 226, and objective lens 228 can be aligned with a primary optical axis 260 of apparatus 104. Secondary optical system 242 and charged-particle detection device 244 can be aligned with a secondary optical axis 252 of apparatus 104.

Charged-particle source 202 can emit one or more charged particles, such as electrons, protons, ions, muons, or any other particle carrying electric charges. In some embodiments, charged-particle source 202 may be an electron source. For example, charged-particle source 202 may include a cathode, an extractor, or an anode, wherein primary electrons can be emitted from the cathode and extracted or accelerated to form primary charged-particle beam 210 (in this case, a primary electron beam) with a crossover (virtual or real) 208. For ease of explanation without causing ambiguity, electrons are used as examples in some of the descriptions herein. However, it should be noted that any charged particle may be used in any embodiment of this disclosure, not limited to electrons. Primary charged-particle beam 210 can be visualized as being emitted from crossover 208. Gun aperture 204 can block off peripheral charged particles of primary charged-particle beam 210 to reduce Coulomb effect. The Coulomb effect may cause an increase in size of probe spots.

Source conversion unit 212 can comprise an array of image-forming elements and an array of beam-limit apertures. The array of image-forming elements can comprise an array of micro-deflectors or micro-lenses. The array of image-forming elements can form a plurality of parallel images (virtual or real) of crossover 208 with a plurality of beamlets 214, 216, and 218 of primary charged-particle beam 210. The array of beam-limit apertures can limit the plurality of beamlets 214, 216, and 218. While three beamlets 214, 216, and 218 are shown in FIG. 2, embodiments of the present disclosure are not so limited. For example, in some embodiments, the apparatus 104 may be configured to generate a first number of beamlets. In some embodiments, the first number of beamlets may be in a range from 1 to 1000. In some embodiments, the first number of beamlets may be in a range from 200-500. In an exemplary embodiment, an apparatus 104 may generate 400 beamlets.

Condenser lens 206 can focus primary charged-particle beam 210. The electric currents of beamlets 214, 216, and 218 downstream of source conversion unit 212 can be varied by adjusting the focusing power of condenser lens 206 or by changing the radial sizes of the corresponding beam-limit apertures within the array of beam-limit apertures. Objective lens 228 can focus beamlets 214, 216, and 218 onto a wafer 230 for imaging, and can form a plurality of probe spots 270, 272, and 274 on a surface of wafer 230.

Beam separator 222 can be a beam separator of Wien filter type generating an electrostatic dipole field and a magnetic dipole field. In some embodiments, if they are applied, the force exerted by the electrostatic dipole field on a charged particle (e.g., an electron) of beamlets 214, 216, and 218 can be substantially equal in magnitude and opposite in a direction to the force exerted on the charged particle by magnetic dipole field. Beamlets 214, 216, and 218 can, therefore, pass straight through beam separator 222 with zero deflection angle. However, the total dispersion of beamlets 214, 216, and 218 generated by beam separator 222 can also be non-zero. Beam separator 222 can separate secondary charged-particle beams 236, 238, and 240 from beamlets 214, 216, and 218 and direct secondary charged-particle beams 236, 238, and 240 towards secondary optical system 242.

Deflection scanning unit 226 can deflect beamlets 214, 216, and 218 to scan probe spots 270, 272, and 274 over a surface area of wafer 230. In response to the incidence of beamlets 214, 216, and 218 at probe spots 270, 272, and 274, secondary charged-particle beams 236, 238, and 240 may be emitted from wafer 230. Secondary charged-particle beams 236, 238, and 240 may comprise charged particles (e.g., electrons) with a distribution of energies. For example, secondary charged-particle beams 236, 238, and 240 may be secondary electron beams including secondary electrons (energies≤50 eV) and backscattered electrons (energies between 50 eV and landing energies of beamlets 214, 216, and 218). Secondary optical system 242 can focus secondary charged-particle beams 236, 238, and 240 onto detection sub-regions 246, 248, and 250 of charged-particle detection device 244. Detection sub-regions 246, 248, and 250 may be configured to detect corresponding secondary charged-particle beams 236, 238, and 240 and generate corresponding signals (e.g., voltage, current, or the like) used to reconstruct an SCPM image of structures on or underneath the surface area of wafer 230.

The generated signals may represent intensities of secondary charged-particle beams 236, 238, and 240 and may be provided to image processing system 290 that is in communication with charged-particle detection device 244, primary projection optical system 220, and motorized wafer stage 280. The movement speed of motorized wafer stage 280 may be synchronized and coordinated with the beam deflections controlled by deflection scanning unit 226, such that the movement of the scan probe spots (e.g., scan probe spots 270, 272, and 274) may orderly cover regions of interests on the wafer 230. The parameters of such synchronization and coordination may be adjusted to adapt to different materials of wafer 230. For example, different materials of wafer 230 may have different resistance-capacitance characteristics that may cause different signal sensitivities to the movement of the scan probe spots.

The intensity of secondary charged-particle beams 236, 238, and 240 may vary according to the external or internal structure of wafer 230, and thus may indicate whether wafer 230 includes defects. Moreover, as discussed above, beamlets 214, 216, and 218 may be projected onto different locations of the top surface of wafer 230, or different sides of local structures of wafer 230, to generate secondary charged-particle beams 236, 238, and 240 that may have different intensities. Therefore, by mapping the intensity of secondary charged-particle beams 236, 238, and 240 with the areas of wafer 230, image processing system 290 may reconstruct an image that reflects the characteristics of internal or external structures of wafer 230.

In some embodiments, image processing system 290 may include an image acquirer 292, a storage 294, and a controller 296. Image acquirer 292 may comprise one or more processors. For example, image acquirer 292 may comprise a computer, server, mainframe host, terminals, personal computer, any kind of mobile computing devices, or the like, or a combination thereof. Image acquirer 292 may be communicatively coupled to charged-particle detection device 244 of beam tool 104 through a medium such as an electric conductor, optical fiber cable, portable storage media, IR, Bluetooth, internet, wireless network, wireless radio, or a combination thereof. In some embodiments, image acquirer 292 may receive a signal from charged-particle detection device 244 and may construct an image. Image acquirer 292 may thus acquire SCPM images of wafer 230. Image acquirer 292 may also perform various post-processing functions, such as generating contours, superimposing indicators on an acquired image, or the like. Image acquirer 292 may be configured to perform adjustments of brightness and contrast of acquired images. In some embodiments, storage 294 may be a storage medium such as a hard disk, flash drive, cloud storage, random access memory (RAM), other types of computer-readable memory, or the like. Storage 294 may be coupled with image acquirer 292 and may be used for saving scanned raw image data as original images, and post-processed images. Image acquirer 292 and storage 294 may be connected to controller 296. In some embodiments, image acquirer 292, storage 294, and controller 296 may be integrated together as one control unit.

In some embodiments, image acquirer 292 may acquire one or more SCPM images of a wafer based on an imaging signal received from charged-particle detection device 244. An imaging signal may correspond to a scanning operation for conducting charged particle imaging. An acquired image may be a single image comprising a plurality of imaging areas. The single image may be stored in storage 294. The single image may be an original image that may be divided into a plurality of regions. Each of the regions may comprise one imaging area containing a feature of wafer 230. The acquired images may comprise multiple images of a single imaging area of wafer 230 sampled multiple times over a time sequence. The multiple images may be stored in storage 294. In some embodiments, image processing system 290 may be configured to perform image processing steps with the multiple images of the same location of wafer 230.

In some embodiments, image processing system 290 may include measurement circuits (e.g., analog-to-digital converters) to obtain a distribution of the detected secondary charged particles (e.g., secondary electrons). The charged-particle distribution data collected during a detection time window, in combination with corresponding scan path data of beamlets 214, 216, and 218 incident on the wafer surface, can be used to reconstruct images of the wafer structures under inspection. The reconstructed images can be used to reveal various features of the internal or external structures of wafer 230, and thereby can be used to reveal any defects that may exist in the wafer.

In some embodiments, the charged particles may be electrons. When electrons of primary charged-particle beam 210 are projected onto a surface of wafer 230 (e.g., probe spots 270, 272, and 274), the electrons of primary charged-particle beam 210 may penetrate the surface of wafer 230 for a certain depth, interacting with particles of wafer 230. Some electrons of primary charged-particle beam 210 may elastically interact with (e.g., in the form of elastic scattering or collision) the materials of wafer 230 and may be reflected or recoiled out of the surface of wafer 230. An elastic interaction conserves the total kinetic energies of the bodies (e.g., electrons of primary charged-particle beam 210) of the interaction, in which the kinetic energy of the interacting bodies does not convert to other forms of energy (e.g., heat, electromagnetic energy, or the like). Such reflected electrons generated from elastic interaction may be referred to as backscattered electrons (BSEs). Some electrons of primary charged-particle beam 210 may inelastically interact with (e.g., in the form of inelastic scattering or collision) the materials of wafer 230. An inelastic interaction does not conserve the total kinetic energies of the bodies of the interaction, in which some or all of the kinetic energy of the interacting bodies convert to other forms of energy. For example, through the inelastic interaction, the kinetic energy of some electrons of primary charged-particle beam 210 may cause electron excitation and transition of atoms of the materials. Such inelastic interaction may also generate electrons exiting the surface of wafer 230, which may be referred to as secondary electrons (SEs). Yield or emission rates of BSEs and SEs depend on, e.g., the material under inspection and the landing energy of the electrons of primary charged-particle beam 210 landing on the surface of the material, among others. The energy of the electrons of primary charged-particle beam 210 may be imparted in part by its acceleration voltage (e.g., the acceleration voltage between the anode and cathode of charged-particle source 202 in FIG. 2). The quantity of BSEs and SEs may be more or fewer (or even the same) than the injected electrons of primary charged-particle beam 210.

The images generated by SEM may be used for defect inspection. For example, a generated image capturing a test device region of a wafer may be compared with a reference image capturing the same test device region. The reference image may be predetermined (e.g., by simulation) and include no known defect. If a difference between the generated image and the reference image exceeds a tolerance level, a potential defect may be identified. For another example, the SEM may scan multiple regions of the wafer, each region including a test device region designed as the same, and generate multiple images capturing those test device regions as manufactured. The multiple images may be compared with each other. If a difference between the multiple images exceeds a tolerance level, a potential defect may be identified.

Figure 3:
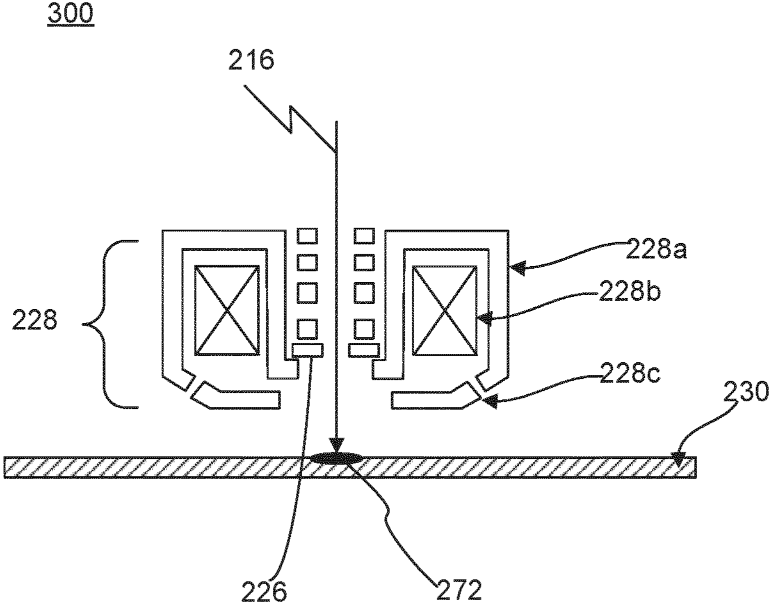
FIG. 3 illustrates a magnetic field generation system of an inspection apparatus, consistent with embodiments of the present disclosure.

FIG. 3 illustrates a magnetic field generation system of an inspection apparatus, consistent with embodiments of the present disclosure. A magnetic field generation system 300 of FIG. 3 may be a part of EBI system 100 of FIG. 1 or electron beam tool 104 of FIG. 2. In some embodiments, magnetic field generation system 300 can generate a system magnetic field of EBI system 100 of FIG. 1 or electron beam tool 104 during operation. As shown in FIG. 3, magnetic field generation system 300 can include an objective lens (e.g., objective lens 228 of FIG. 2), and objective lens 228 can include a pole piece 228*a*, an exciting coil 228*b*, and a control electrode 228*c*. In some embodiments, objective lens 228 can be a modified SORIL lens. In a detection or imaging process, a beam (e.g., beamlet 216) can be focused into a probe spot (e.g., probe spot 272) by objective lens 228 and impinge onto the surface of wafer 230. As discussed, probe spot 272 may be scanned across the surface of wafer 230 by a deflection scanning unit, such as deflection scanning unit 226 or other deflectors in the SORIL lens. While FIG. 3 illustrates only one beam 216, it will be appreciated that multiple beams can simultaneously scan the surface of wafer 230 as shown in FIG. 2.

Figure 4A:
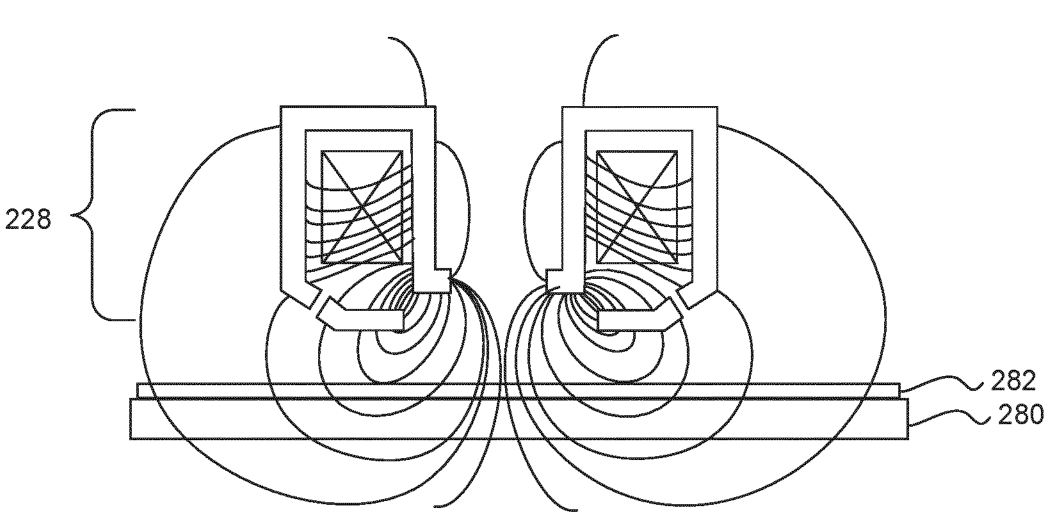
FIG. 4A illustrates a static magnetic field caused by a magnetic field generation system of FIG. 3, consistent with embodiments of the present disclosure.

In some embodiments, magnetic field generation system 300 including objective lens 228 may be configured to generate a magnetic field around or in beam tool 104 during operation. FIG. 4A illustrates a static magnetic field generated by magnetic field generation system 300 of FIG. 3, consistent with some embodiments of the present disclosure. As shown in FIG. 4A, at least part of a motorized stage 280 and wafer holder 282 may be positioned in a magnetic field of a beam tool. In this disclosure, a motorized stage 280 and wafer holder 282 can be collectively referred to as a wafer stage.

When a conductor moves in a magnetic field, eddy currents may be induced in the conductor according to Faraday's law of induction. Eddy currents flow in closed loops within a conductor. In some embodiments in which a conductor(s) is included in a wafer stage, eddy currents can be induced in the conductor during operation of a beam tool as motorized stage 280 moves for scanning a wafer. In some embodiments, a wafer stage can be implemented to include a conductor(s). For example, wafer holder 282 can be made of a conductive material(s) such as aluminum, titanium, etc. When wafer holder 282 is a conductor, eddy currents may be induced in wafer holder 282 as wafer holder 282 moves in a magnetic field generated by magnetic field generation system 300 of a beam tool.

Figure 4B:
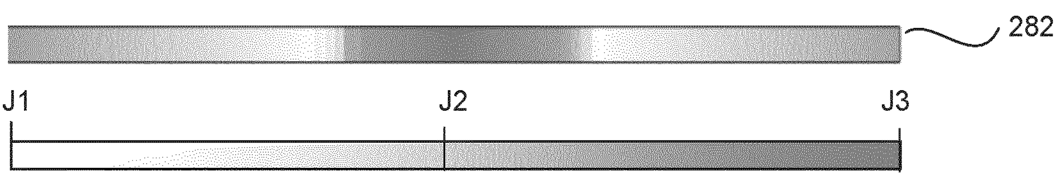
FIG. 4B illustrates eddy currents in a conductor resulting from movement of a wafer stage, consistent with embodiments of the present disclosure.

FIG. 4B illustrates eddy currents in a conductor resulting from movement of a wafer stage, consistent with embodiments of the present disclosure. In FIG. 4B, it is assumed that wafer holder 282 is a conductor for illustration purposes. In FIG. 4B, current density J A/m2 is defined by a contrast bar at the bottom. In this example, a first current density J1 is lower than a second current density J2, which in turn is lower than a third current density J3. In FIG. 4B, eddy current density induced in wafer holder 282 is indicated in wafer holder 282 when wafer holder 282 made of titanium moves at a speed 400 mm/s. As shown in FIG. 4B, eddy current density is not uniform across wafer holder 282. For example, eddy current density may vary depending on a location on wafer holder 282.

Figure 4C:
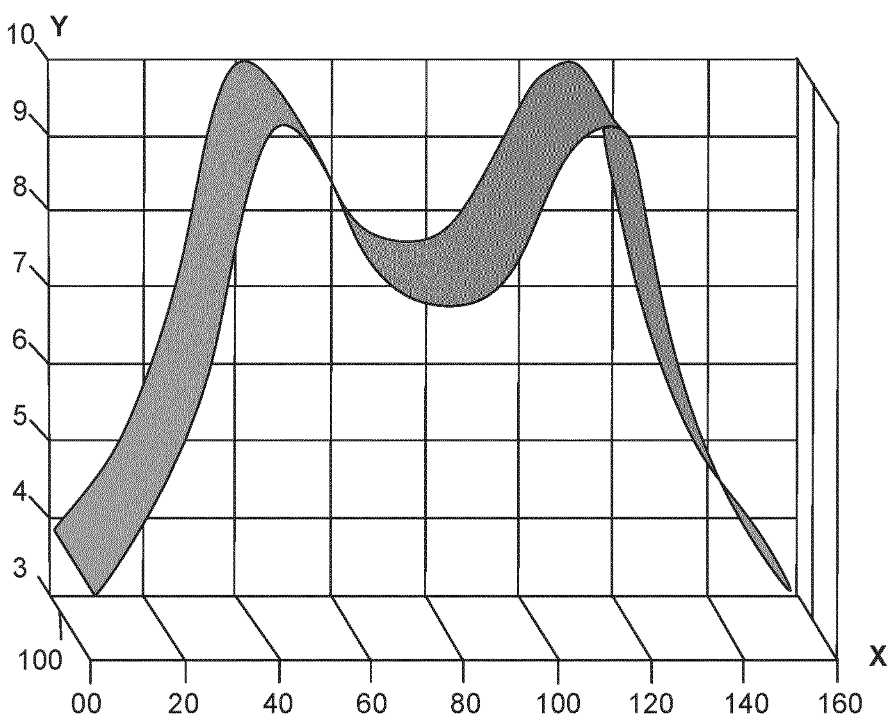
FIG. 4C illustrates a disturbance magnetic field caused by eddy currents in a conductor, consistent with embodiments of the present disclosure.

In turn, the induced eddy currents in wafer holder 282 can generate a magnetic field that disturbs beam tool's magnetic field generated by magnetic field generation system 300. FIG. 4C illustrates a disturbance magnetic field caused by eddy currents in a conductor, consistent with embodiments of the present disclosure. In FIG. 4C, an X-axis indicates a distance from the left end of a wafer (e.g., wafer 230) held by wafer holder 282 to the right end of the wafer, and a Y-axis indicates a magnitude of a disturbance magnetic field on the wafer caused by eddy currents in wafer holder 282. As shown in FIG. 4C, a disturbance magnetic field caused by eddy currents in moving wafer holder 282 exerts an influence on a point of interest on a wafer and thus disturbs a system magnetic field of a beam tool, for example, generated by magnetic field generation system 300.

However, an inspection apparatus (e.g., EBI system 100 of FIG. 1 or electron beam tool 104) is susceptible to such magnetic field disturbances. For example, such disturbance magnetic field can cause a beam displacement from a target beam position on a wafer when scanning the wafer, which in turn leads to image quality degradation. In order to prevent eddy currents from being induced, a wafer stage with an eddy current suppression design has been utilized. An eddy current suppression design may include a non-conductive wafer holder instead of a conductive wafer holder. In this case, a non-conductive plate can be coated with a conductive material to be used as a wafer holder, e.g., for surface charge suppression. For example, chromium coated ceramic is used as a wafer holder. However, such alternative design is usually pricy to manufacture due to materials used for coating (e.g., chromium) or a non-conductive material (e.g., ceramic). Further, such coating requires frequent maintenance.

In addition to the cost and cumbersome reasons, using a non-conductive plate coated with a conductive material as a wafer holder may exacerbate arcing issues when conducting a high voltage inspection of a wafer. Arcing can occur on conductive coating when inspecting a wafer with a high voltage, and the arcing can cause particles of the coating to make a breakaway. Particles left from the coating may contaminate an inspection as well as a wafer, and thereby worsen the arcing effects. Embodiments of the present disclosure may provide methods or systems to offset eddy current effects while utilizing a wafer stage including conductor(s), e.g., a conductor wafer holder.

Figure 5:
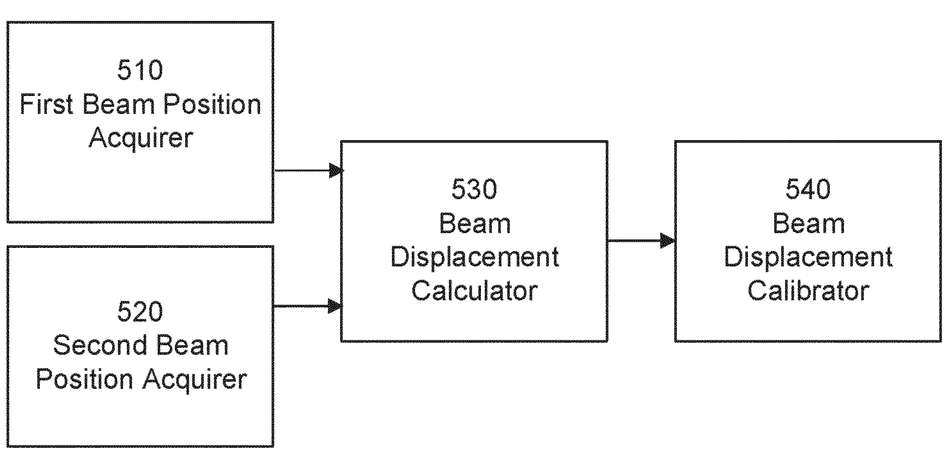
FIG. 5 is a block diagram of a beam displacement compensation system, consistent with embodiments of the present disclosure.

FIG. 5 is a block diagram of a beam displacement compensation system, consistent with embodiments of the present disclosure. In some embodiments, a beam displacement compensation system 500 comprises one or more processors and memories. It is appreciated that in various embodiments beam displacement compensation system 500 may be part of or may be separate from a charged-particle beam inspection system (e.g., EBI system 100 of FIG. 1). In some embodiments, beam displacement compensation system 500 may include one or more components (e.g., software modules) that can be implemented in controller 109 or system 290 as discussed herein. As shown in FIG. 5, beam displacement compensation system 500 may comprise a first beam position acquirer 510, a second beam position acquirer 520, a beam displacement calculator 530, and beam displacement calibrator 540.

According to some embodiments of the present disclosure, first beam position acquirer 510 can acquire a first beam position on a test wafer while a wafer stage supporting the test wafer moves at a first velocity. In some embodiments, a first beam position on a test wafer can be measured from a first inspection image acquired while a wafer stage moves at a first velocity $V_1$. While velocity can represent both a speed at a wafer stage moves and a direction of the wafer stage's movement in this disclosure, it will be appreciated that velocity can also be used to refer to a speed in some embodiments. In some embodiments, an inspection image is a SEM image of a sample or a wafer. In some embodiments, an inspection image can be an inspection image generated by, e.g., EBI system 100 of FIG. 1 or electron beam tool 104 of FIG. 2. In some embodiments, an inspection image can be obtained from a storage device or system storing the inspection image.

Figure 6A:
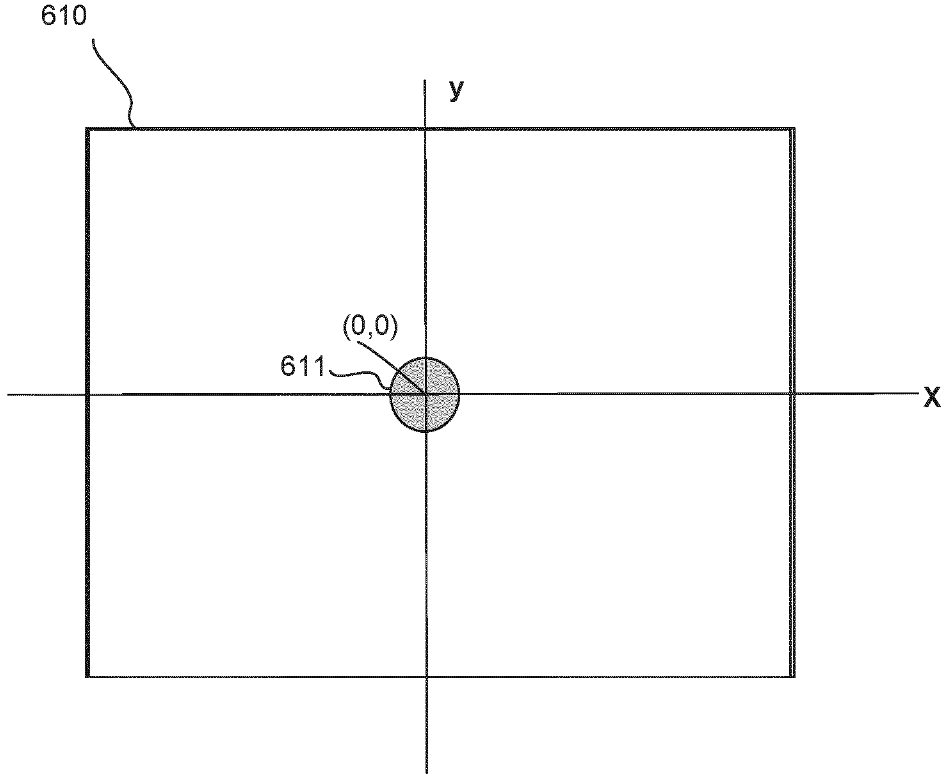
FIG. 6A illustrates an example first inspection image, consistent with some embodiments of the present disclosure.

According to some embodiments of the present disclosure, a first inspection image can be acquired when a wafer stage is stationary, i.e., a first velocity $V_1$ is zero. In some embodiments, a first inspection image can be acquired when a disturbance magnetic field, e.g., caused by eddy currents in a moving conductor does not exist. FIG. 6A illustrates an example first inspection image 610, consistent with some embodiments of the present disclosure. In FIG. 6A, a position on a test wafer can be represented by x and y coordinates where a center of the test wafer is represented as (0,0). FIG. 6A shows a first beam 611 positioned at a center of first inspection image 610, which indicates first beam 611 impinges on a test wafer at a center of the test wafer. While first beam 611 positioned at the wafer center is described, it will be appreciated that first beam 611 can be positioned on any part of a wafer.

In some embodiments, a wafer having known patterns at corresponding locations on the wafer can be used as a test wafer. In some embodiments, a beam position on a wafer can be determined by matching a pattern of an SEM image taken by a first beam with a corresponding pattern on the wafer and by identifying a location of the corresponding pattern on the wafer. In some embodiments, a reference image of a test wafer can be utilized to determine patterns of a test wafer and corresponding locations of the patterns on the test wafer. In some embodiments, a reference image can be a golden image or a layout file for a wafer design corresponding to a test wafer. The layout file can be in a Graphic Database System (GDS) format, Graphic Database System II (GDS II) format, an Open Artwork System Interchange Standard (OASIS) format, a Caltech Intermediate Format (CIF), etc. The wafer design may include patterns or structures for inclusion on the wafer. The patterns or structures can be mask patterns used to transfer features from the photolithography masks or reticles to a wafer. In some embodiments, a layout in GDS or OASIS format, among others, may comprise feature information stored in a binary file format representing planar geometric shapes, text, and other information related to the wafer design. In some embodiments, a reference image can be an image rendered from the layout file.

Referring back to FIG. 5, according to some embodiments of the present disclosure, second beam position acquirer 520 can acquire a second beam position on a test wafer while a wafer stage supporting the test wafer moves at a second velocity. In some embodiments, a second beam position on the test wafer can be measured from a second inspection image acquired while a wafer stage moves at a second velocity $V_2$. In some embodiments, a second inspection image is a SEM image of a sample or a wafer. In some embodiments, a second inspection image can be an inspection image generated by, e.g., EBI system 100 of FIG. 1 or electron beam tool 104 of FIG. 2. In some embodiments, a second inspection image can be obtained from a storage device or system storing the second inspection image.

Figure 6B:
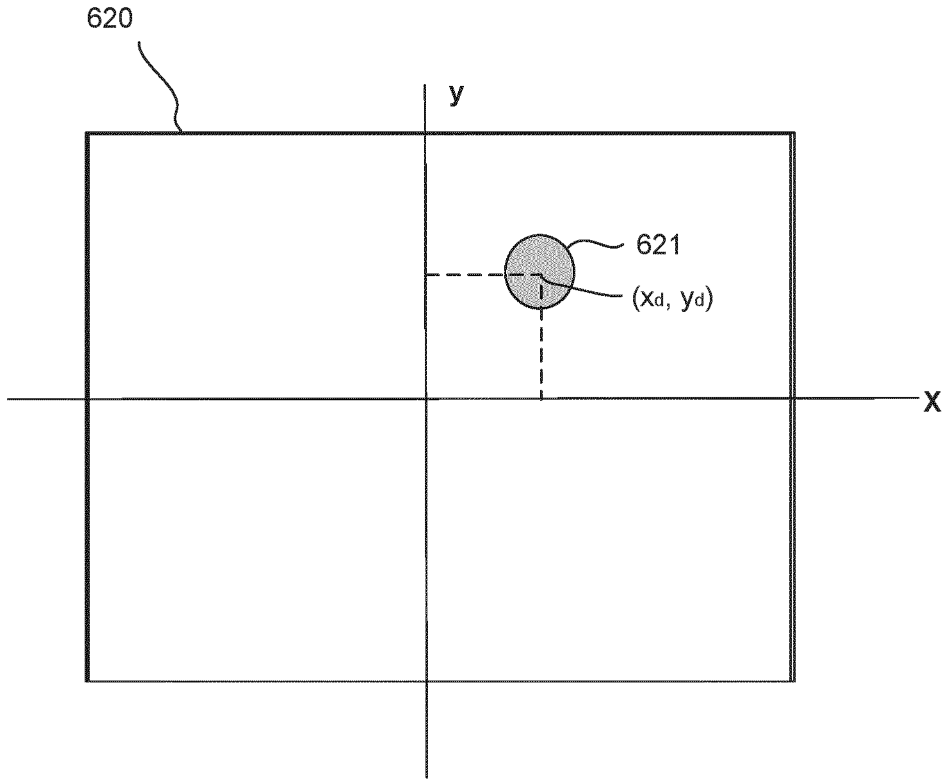
FIG. 6B illustrates an example second inspection image, consistent with some embodiments of the present disclosure.

According to some embodiments of the present disclosure, a second inspection image can be acquired when a wafer stage moves at a second velocity that is different from a first velocity. In some embodiments, a second velocity can be set as a maximum velocity of a wafer stage of a beam tool. In some embodiments, a second inspection image can be acquired when a disturbance magnetic field, e.g., caused by eddy currents in a moving conductor exists. In some embodiments, a second inspection image can be acquired under a same inspection condition as the first inspection image except that a wafer stage moves at a different velocity. In some embodiments, an inspection condition includes, but is not limited to, a beam deflection degree, a system magnetic field, an operation voltage, a beam current, a target beam position on a wafer, etc. FIG. 6B illustrates an example second inspection image 620 and a second beam 621, consistent with some embodiments of the present disclosure. It is assumed that a target beam position of second beam 621 is the same as first beam 611, i.e., the wafer center (0,0) as shown in FIG. 6A in that second inspection image 620 is acquired under the same condition as first inspection image 610 except the wafer stage's movement. FIG. 6B shows second beam 621 positioned at a position ($x_d$, $y_d$) on second inspection image 620, which is displaced from the target beam position, i.e., the wafer center (0, 0).

Referring back to FIG. 5, beam displacement calculator 530 can calculate a beam position displacement of a beam when inspecting a wafer while a wafer stage moves at a third velocity in a range of velocities from a first velocity to a second velocity. While some embodiments will be explained by assuming a first velocity is zero, it will be appreciated that the present disclosure can also be applied to some embodiments in which a first velocity is non-zero.

Figure 6C:
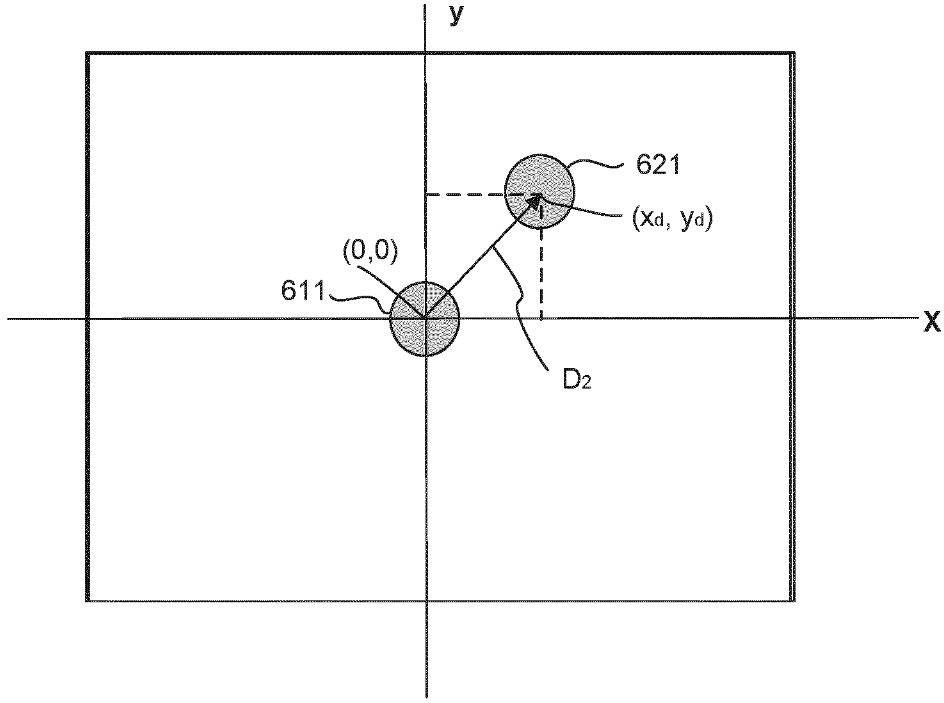
FIG. 6C illustrates a beam position displacement of a second beam with respect to a first beam, consistent with some embodiments of the present disclosure.

In some embodiments where a third velocity is equal to a second velocity, a beam position displacement of a beam can be equal to a beam position displacement of a second beam with respect to a first beam. As shown in FIG. 6C, which illustrates a beam position displacement between first beam 611 and second beam 621, second beam 621 is displaced from first beam 611 by displacement $D_2$. In some embodiments, a beam position displacement can be measured in an X-Y plane. As shown in FIG. 6C, a position of second beam 621 is deviated from a position of first beam 611 by distance $x_d$ in an X-direction and distance $y_d$ in a Y-direction. In some embodiments, displacement $D_2$ can represent a displacement scalar quantity or both a displacement scalar quantity and a direction of the displacement. In some embodiments, a beam position displacement of a second beam with respect to a first beam can also be measured in a z-direction. In some embodiments, a beam position displacement in a z-direction can be measured by a focal point displacement of a second beam from a focal point of a first beam. For example, while a focal point of a first beam may be placed on a surface of a wafer that is a target for inspection, a focal point of a second beam may be placed on a plane lower or higher than the wafer surface in a z-direction. In some embodiments, a focal point of a beam can be determined based on a degree of inspection image blurring. In some embodiments, a focal point of a beam can be determined based on a size of a beam spot on an inspection image. While some embodiments will be explained for a position displacement in an X-Y plane, it will be appreciated that the present disclosure can be applied to some embodiments where a beam position is displaced in a z-direction.

In some embodiments where a third velocity is greater than a first velocity and less than a second velocity, a beam position displacement of a beam can be calculated based on a beam displacement of a second beam. In some embodiments, displacement $D_2$ of second beam 621 can be understood to result from a disturbance magnetic field caused by eddy currents in a moving conductor as first inspection image 610 and second inspection image 620 are obtained under the inspection conditions but wafer stage's velocity. Since eddy current density in a moving conductor has a linear relationship with a velocity of the moving conductor, a beam position displacement can be determined based on the velocity of the moving conductor. As described referring to FIG. 4B, since eddy current density is not uniform in a moving conductor and thus a disturbance magnetic field varies depending on an X-Y location of a wafer, a beam position displacement can further be determined based on an X-Y position of a beam on a wafer.

FIG. 7 illustrates an example beam displacement table, consistent with some embodiments of the present disclosure. In FIG. 7, a displacement table 700 lists positions $P_1$ to $P_n$ on a wafer in a first row. In some embodiments, positions $P_1$ to $P_n$ on a wafer can be a beam position on a X-Y plane of a wafer. For example, position (0, 0) of first beam 611 in first inspection image 610 can be a first position $P_1$. Positions $P_2$ to $P_n$ can be positions on a wafer other than first position $P_1$. In some embodiments, positions $P_1$ to $P_n$ can be target positions of beams on a wafer. While acquiring a beam position displacement of second beam 621 from first beam 611 targeting at one position (e.g., first position P1) has been illustrated, it will be appreciated that the present disclosure can also be utilized to acquire multiple beam position displacements of second beam 621 from first beam 611 targeting at multiple positions (e.g., positions $P_2$ to $P_n$) on a wafer.

In FIG. 7, displacement table 700 further lists a velocity $V_2$ in a first column. In some embodiments, velocity $V_2$ in FIG. 7 can be a maximum velocity of a wafer stage of a beam tool. In FIG. 7, displacement values $D_{21}$ to $D_{2n}$ in a second row can be beam position displacements of a second beam with respect to a first beam. For example, a beam position displacement (e.g., by distance $x_d$ in an X-direction and distance $y_d$ in a Y-direction) of second beam 621 from first beam 611 can be a first displacement $D_{21}$. Similarly, beam position displacements of second beams with respect to corresponding first beams on different positions $P_2$ to $P_n$ on a wafer can be beam position displacements $D_{22}$ to $D_{2n}$.

According to some embodiments where a third velocity is greater than a first velocity and less than a second velocity, a beam position displacement of a beam can be calculated based on a beam location on a wafer and the first to third velocities. In some embodiments, a beam position displacement of a beam can be calculated based on beam displacement table 700. As described, eddy currents generated in a conductor are proportional to a velocity of the conductor, and thus a beam displacement caused by eddy currents also has a linear relationship with a velocity. In some embodiments, a beam position displacement of a beam for inspecting a wafer while a wafer stage moves at a third velocity $V_3$ can be calculated by a ratio of third velocity $V_3$ to second velocity $V_2$. For example, a beam position displacement $D_{31}$ of a third beam targeting at first position $P_1$ while a wafer stage moves at third velocity $V_3$ can be determined by multiplying first beam displacement of second beam 621 targeting at first position $P_1$ by a ratio $V_3/V_2$, i.e., $D_{31}=D_{21}*V_3/V_2$. Similarly, beam position displacements $D_{32}$ to $D_{3n}$ of a third beam targeting at positions $P_2$ to $P_n$ can be determined based on a ratio $V_3/V_2$ and corresponding beam displacements $D_{22}$ to $D_{2n}$ of a second beam.

Referring back to FIG. 5, beam displacement calibrator 540 can adjust a beam position on a wafer for inspecting a wafer while a wafer stage moves at a third velocity. In some embodiments, beam displacement calibrator 540 can adjust a beam position based on a beam displacement for a beam determined by beam displacement calculator 530.

In some embodiments, beam displacement calibrator 540 can adjust a beam position to offset a beam position displacement of a beam. In some embodiments, beam displacement calibrator 540 can generate a control signal to offset a beam position displacement of a beam. For example, beam displacement calibrator 540 can generate a control signal to adjust an operational parameter(s) of a deflection scanning unit, e.g., deflection scanning unit 226 of FIG. 2. In some embodiments, the control signal to offset the beam displacement can be sent to a driver for a deflection scanning unit. In some embodiments in which a beam position is displaced in a Z-direction, beam displacement calibrator 540 can generate a control signal to offset a beam position displacement in a Z-direction. For example, beam displacement calibrator 540 can generate a control signal to adjust a height of a wafer, and the control signal can be sent to a wafer stage controller.

According to some embodiments, a beam displacement of a beam may be caused by a disturbance magnetic field, e.g., induced by movement of a wafer stage at a third velocity. In some embodiments, beam displacement calibrator 540 can adjust a system magnetic field of beam tool 104 to offset the disturbance magnetic field. For example, beam displacement calibrator 540 can generate a control signal to adjust an operational parameter(s) of an objective lens, e.g., objective lens 228 of FIG. 2 and FIG. 3 to cancel or minimize the disturbance magnetic field. In some embodiments, the control signal to offset effects of the disturbance magnetic field can be sent to a driver for an objective lens.

In some embodiments, beam displacement calibrator 540 can generate a control signal to adjust an operational parameter(s) of any components of an inspection apparatus (e.g., EBI system 100 of FIG. 1 or electron beam tool 104 of FIG. 2) to compensate a beam displacement of a beam or to offset disturbance magnetic fields. For example, beam displacement calibrator 540 can generate a control signal to adjust an operation voltage, a beam current, a magnetic field generation current, etc. In some embodiments, beam displacement calibrator 540 can generate a control signal to adjust an operation parameter of an external apparatus other than an inspection apparatus (e.g., EBI system 100 of FIG. 1 or electron beam tool 104 of FIG. 2) to compensate a beam displacement of a beam or to offset disturbance magnetic fields. For example, an external apparatus can be utilized to cancel disturbance magnetic fields or to offset beam displacements.

Figure 8:
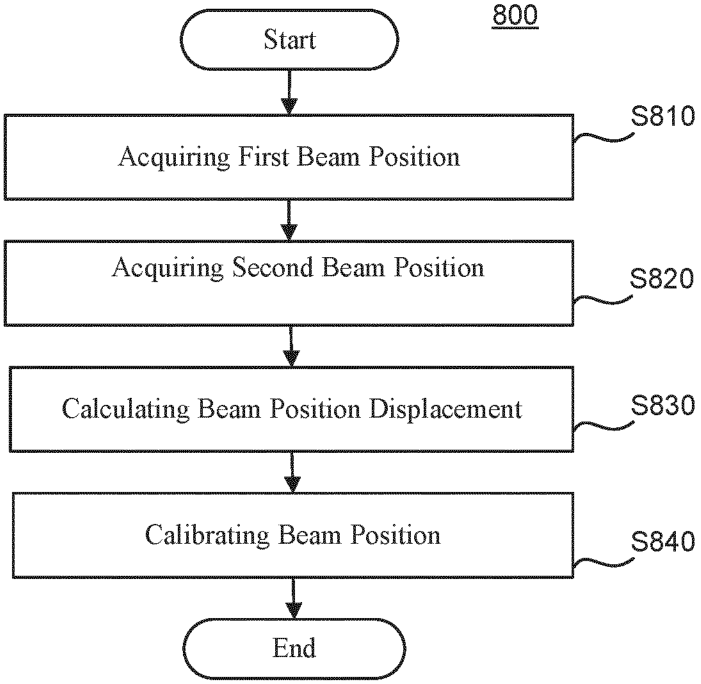
FIG. 8 is a process flowchart representing an exemplary beam displacement compensation method, consistent with embodiments of the present disclosure.

FIG. 8 is a process flowchart representing an exemplary beam displacement compensation method, consistent with embodiments of the present disclosure. The steps of method 800 can be performed by a system (e.g., system 500 of FIG. 5) executing on or otherwise using the features of a computing device, e.g., controller 109 of FIG. 1. It is appreciated that the illustrated method 800 can be altered to modify the order of steps and to include additional steps.

In step S810, a first beam position can be acquired. Step S810 can be performed by, for example, first beam position acquirer 510, among others. According to some embodiments of the present disclosure, a first beam position on a test wafer can be acquired while a wafer stage supporting the test wafer moves at a first velocity. In some embodiments, a first beam position on a test wafer can be measured from a first inspection image acquired while a wafer stage moves at a first velocity $V_1$. In some embodiments, a first inspection image can be acquired when a wafer stage is stationary, i.e., a first velocity $V_1$ is zero.

In step S820, a second beam position can be acquired. Step S820 can be performed by, for example, second beam position acquirer 520, among others. According to some embodiments of the present disclosure, a second beam position on a test wafer can be acquired while a wafer stage supporting the test wafer moves at a second velocity. In some embodiments, a second beam position on the test wafer can be measured from a second inspection mage acquired while a wafer stage moves at a second velocity $V_2$. According to some embodiments of the present disclosure, a second inspection image can be acquired when a wafer stage moves at a second velocity that is different from a first velocity. In some embodiments, a second velocity can be set as a maximum velocity of a wafer stage of a beam tool. In some embodiments, a second inspection image can be acquired when a disturbance magnetic field, e.g., caused by eddy currents in a moving conductor exists. In some embodiments, a second inspection image can be acquired under a same inspection condition as the first inspection image except that a wafer stage moves at a different velocity. In some embodiments, a target position of a second beam is the same as a first beam.

In step S830, a beam position displacement of a beam can be calculated. Step S830 can be performed by, for example, beam displacement calculator 530, among others. According to some embodiments of the present disclosure, a beam position displacement of a beam when inspecting a wafer while a wafer stage moves at a third velocity can be calculated. In some embodiments, the third velocity is in a range of velocities from a first velocity to a second velocity.

In some embodiments where a third velocity is equal to a second velocity, a beam position displacement of a beam can be equal to a beam position displacement of a second beam with respect to a first beam. In some embodiments where a third velocity is greater than a first velocity and less than a second velocity, a beam position displacement of a beam can be calculated based on a beam displacement of a second beam. Since eddy current density in a moving conductor has a linear relationship with a velocity of the moving conductor, a beam position displacement can be determined based on the velocity of the moving conductor. As described referring to FIG. 4B, since eddy current density is not uniform in a moving conductor and thus a disturbance magnetic field varies depending on an X-Y location of a wafer, a beam position displacement can further be determined based on an X-Y position of a beam on a wafer. The process of calculating a beam position displacement has been described referring to FIG. 6C and FIG. 7, and thus the detailed explanation will be omitted here for simplicity purposes.

In step S840, a beam position of a beam can be adjusted. Step S840 can be performed by, for example, beam displacement calibrator 540, among others. According to some embodiments, a beam position on a wafer for inspecting a wafer while a wafer stage moves at a third velocity can be adjusted. In some embodiments, a beam position can be adjusted based on a beam displacement for the beam determined at step S830. In some embodiments, a beam position can be adjusted to offset a beam position displacement of a beam. In some embodiments, a control signal to offset a beam position displacement of a beam can be generated. In some embodiments, a system magnetic field of beam tool 104 can be adjusted to offset the disturbance magnetic field. In some embodiments, a control signal to adjust an operational parameter(s) of any components of an inspection apparatus (e.g., EBI system 100 of FIG. 1 or electron beam tool 104 of FIG. 2) can be generated to compensate a beam displacement of a beam or to offset disturbance magnetic fields. In some embodiments, a control signal can be generated to adjust an operation parameter of an external apparatus other than an inspection apparatus (e.g., EBI system 100 of FIG. 1 or electron beam tool 104 of FIG. 2) to compensate a beam displacement of a beam or to offset disturbance magnetic fields.

A non-transitory computer readable medium may be provided that stores instructions for a processor of a controller (e.g., controller 109 of FIG. 1) to carry out, among other things, image inspection, image acquisition, stage positioning, beam focusing, electric field adjustment, beam bending, condenser lens adjusting, activating charged-particle source, beam deflecting, and method 800. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

The embodiments may further be described using the following clauses:

1. A method for correcting inspection image error, comprising:
   acquiring a set of first beam positions on a test wafer while a wafer stage supporting the test wafer moves at a first velocity;
   acquiring a set of second beam positions, corresponding to the set of first beam positions, on the test wafer while the wafer stage moves at a second velocity;
   calculating a beam position displacement of a beam while the wafer stage moves at a third velocity in a range of velocities from the first velocity to the second velocity; and
   adjusting a beam position of the beam based on the calculated beam position displacement.
2. The method of clause 1, wherein the first velocity is zero.
3. The method of clause 1 or 2, wherein adjusting the beam position comprises:
   generating a control signal to adjust an operational parameter of a beam deflector.
4. The method of clause 1 or 2, wherein adjusting the beam position comprises:
   generating a control signal to adjust a magnetic field of a beam inspection tool during operation.
5. The method of any one of clauses 1-4, wherein adjusting the beam position comprises:
   adjusting the beam position based on a target position of the beam on a wafer, the first and second beam positions, the first and second velocities, and the third velocity.
6. The method of any one of clauses 1-5, wherein adjusting the beam position comprises: adjusting the beam position by offsetting the calculated beam position displacement.
7. The method of any one of clauses 1-6, wherein the beam position displacement is calculated based on a target position of the beam on a wafer, a first beam position among the set of first beam positions corresponding to the target position and a second beam position among the set of second beam positions corresponding to the target position, the first and second velocities, and the third velocity.

8. The method of any one of clauses 1-7, wherein adjusting the beam position comprises:

adjusting the beam position by offsetting a magnetic field disturbance caused by the wafer stage movement at the third velocity.

9. The method of any one of clauses 1-8, further comprising:

inspecting a wafer based on the adjusted beam position on the wafer while the wafer stage moves at the third velocity.

10. The method of any one of clauses 1-9, wherein the wafer stage includes a conductor.

11. A method for correcting inspection image error, comprising:

acquiring first beam positions on a test wafer while a wafer stage supporting the test wafer is stationary;

acquiring second beam positions on the test wafer while the wafer stage moves at a first velocity, the second beam positions corresponding to the first beam positions;

determining position displacements of the second beam positions from the corresponding first beam positions; and adjusting a beam position of a beam for inspecting a wafer based on a target position of the beam on the wafer, a corresponding position displacement among the determined position displacements, and the first velocity.

12. The method of clause 11, wherein the position displacements of the second beam positions include a first position displacement and a second position displacement, and the first position displacement is different from the second position displacement.

13. The method of clause 11 or 12, further comprising:

determining a beam displacement of the beam while the wafer stage moves at a second velocity that is different from the first velocity.

14. The method of clause 13, wherein determining the beam displacement of the beam comprises:

determining the beam displacement of the beam based on the corresponding position displacement and a ratio of the second velocity to the first velocity.

15. The method of clause 14, wherein adjusting the beam position comprises:

adjusting the beam position of the beam based on the beam displacement of the beam.

16. The method of any one of clauses 11-15, wherein adjusting the beam position comprises:

generating a control signal to adjust an operational parameter of a beam deflector.

17. The method of any one of clauses 11-16, wherein adjusting the beam position comprises:

generating a control signal to adjust a magnetic field of a beam inspection tool during operation.

18. The method of any one of clauses 13-15, wherein adjusting the beam position comprises:

adjusting the beam position by offsetting the determined beam displacement.

19. The method of any one of clauses 13-15, wherein adjusting the beam position comprises:

adjusting the beam position by offsetting a magnetic field disturbance caused by the wafer stage movement at the second velocity.

20. The method of any one of clauses 11-19, further comprising:

inspecting the wafer based on the adjusted beam position on the wafer while the wafer stage moves at the second velocity.

21. An apparatus for correcting inspection image error, comprising:

a memory storing a set of instructions; and at least one processor configured to execute the set of instructions to cause the apparatus to perform:

acquiring a set of first beam positions on a test wafer while a wafer stage supporting the test wafer moves at a first velocity;

acquiring a set of second beam positions, corresponding to the set of first beam positions, on the test wafer while the wafer stage moves at a second velocity;

calculating a beam position displacement of a beam while the wafer stage moves at a third velocity in a range of velocities from the first velocity to the second velocity; and adjusting a beam position of the beam based on the calculated beam position displacement.

22. The apparatus of clause 21, wherein the first velocity is zero.

23. The apparatus of clause 21 or 22, wherein, in adjusting the beam position, the at least one processor is configured to execute the set of instructions to cause the apparatus to perform:

generating a control signal to adjust an operational parameter of a beam deflector.

24. The apparatus of clause 21 or 22, wherein, in adjusting the beam position, the at least one processor is configured to execute the set of instructions to cause the apparatus to perform:

generating a control signal to adjust a magnetic field of a beam inspection tool during operation.

25. The apparatus of any one of clause 21-24, wherein, in adjusting the beam position, the at least one processor is configured to execute the set of instructions to cause the apparatus to perform:

adjusting the beam position based on a target position of the beam on a wafer, the first and second beam positions, the first and second velocities, and the third velocity.

26. The apparatus of any one of clause 21-25, wherein, in adjusting the beam position, the at least one processor is configured to execute the set of instructions to cause the apparatus to perform:

adjusting the beam position by offsetting the calculated beam position displacement.

27. The apparatus of any one of clause 21-26, wherein the beam position displacement is calculated based on a target position of the beam on a wafer, a first beam position among the set of first beam positions corresponding to the target position and a second beam position among the set of second beam positions corresponding to the target position, the first and second velocities, and the third velocity.

28. The apparatus of any one of clause 21-27, wherein, in adjusting the beam position, the at least one processor is configured to execute the set of instructions to cause the apparatus to perform:

adjusting the beam position by offsetting a magnetic field disturbance caused by the wafer stage movement at the third velocity.

29. The apparatus of any one of clause 21-28, wherein the at least one processor is configured to execute the set of instructions to cause the apparatus to further perform:

inspecting a wafer based on the adjusted beam position on the wafer while the wafer stage moves at the third velocity.

30. The apparatus of any one of clause 21-29, wherein the wafer stage includes a conductor.

31. An apparatus for correcting inspection image error, comprising:

a memory storing a set of instructions; and at least one processor configured to execute the set of instructions to cause the apparatus to perform:

acquiring first beam positions on a test wafer while a wafer stage supporting the test wafer is stationary;

acquiring second beam positions on the test wafer while the wafer stage moves at a first velocity, the second beam positions corresponding to the first beam positions;

determining position displacements of the second beam positions from the corresponding first beam positions; and adjusting a beam position of a beam for inspecting a wafer based on a target position of the beam on the wafer, a corresponding position displacement among the determined position displacements, and the first velocity.

32. The apparatus of clause 31, wherein the position displacements of the second beam positions include a first position displacement and a second position displacement, and the first position displacement is different from the second position displacement.

33. The apparatus of clause 31 or 32, wherein the at least one processor is configured to execute the set of instructions to cause the apparatus to further perform:

determining a beam displacement of the beam while the wafer stage moves at a second velocity that is different from the first velocity.

34. The apparatus of clause 33, wherein, in determining the beam displacement of the beam, the at least one processor is configured to execute the set of instructions to cause the apparatus to perform:

determining the beam displacement of the beam based on the corresponding position displacement and a ratio of the second velocity to the first velocity.

35. The apparatus of clause 34, wherein, in adjusting the beam position, the at least one processor is configured to execute the set of instructions to cause the apparatus to perform:

adjusting the beam position of the beam based on the beam displacement of the beam.

36. The apparatus of any one of clauses 31-35, wherein, in adjusting the beam position, the at least one processor is configured to execute the set of instructions to cause the apparatus to perform:

generating a control signal to adjust an operational parameter of a beam deflector.

37. The apparatus of any one of clauses 31-36, wherein, in adjusting the beam position, the at least one processor is configured to execute the set of instructions to cause the apparatus to perform:

generating a control signal to adjust a magnetic field of a beam inspection tool during operation.

38. The apparatus of any one of clauses 33-35, wherein, in adjusting the beam position, the at least one processor is configured to execute the set of instructions to cause the apparatus to perform:

adjusting the beam position by offsetting the determined beam displacement.

39. The apparatus of any one of clauses 33-35, wherein, in adjusting the beam position, the at least one processor is configured to execute the set of instructions to cause the apparatus to perform:

adjusting the beam position by offsetting a magnetic field disturbance caused by the wafer stage movement at the second velocity.

40. The apparatus of any one of clauses 31-39, wherein the at least one processor is configured to execute the set of instructions to cause the apparatus to further perform:

inspecting the wafer based on the adjusted beam position on the wafer while the wafer stage moves at the second velocity.

41. A non-transitory computer readable medium that stores a set of instructions that is executable by at least on processor of a computing device to cause the computing device to perform a method for correcting inspection image, the method comprising:

acquiring a set of first beam positions on a test wafer while a wafer stage supporting the test wafer moves at a first velocity;

acquiring a set of second beam positions, corresponding to the set of first beam positions, on the test wafer while the wafer stage moves at a second velocity;

calculating a beam position displacement of a beam while the wafer stage moves at a third velocity in a range of velocities from the first velocity to the second velocity; and adjusting a beam position of the beam based on the calculated beam position displacement.

42. The computer readable medium of clause 41, wherein the first velocity is zero.

43. The computer readable medium of clause 41 or 42, wherein, in adjusting the beam position, the set of instructions that is executable by at least one processor of the computing device cause the computing device to perform:

generating a control signal to adjust an operational parameter of a beam deflector.

44. The computer readable medium of clause 41 or 42, wherein, in adjusting the beam position, the set of instructions that is executable by at least one processor of the computing device cause the computing device to perform:

generating a control signal to adjust a magnetic field of a beam inspection tool during operation.

45. The computer readable medium of any one of clause 41-44, wherein, in adjusting the beam position, the set of instructions that is executable by at least one processor of the computing device cause the computing device to perform:

adjusting the beam position based on a target position of the beam on a wafer, the first and second beam positions, the first and second velocities, and the third velocity.

46. The computer readable medium of any one of clause 41-45, wherein, in adjusting the beam position, the set of instructions that is executable by at least one processor of the computing device cause the computing device to perform:

adjusting the beam position by offsetting the calculated beam position displacement.

47. The computer readable medium of any one of clause 41-46, wherein the beam position displacement is calculated based on a target position of the beam on a wafer, a first beam position among the set of first beam positions corresponding to the target position and a second beam position among the set of second beam positions corresponding to the target position, the first and second velocities, and the third velocity.

48. The computer readable medium of any one of clause 41-47, wherein, in adjusting the beam position, the set of instructions that is executable by at least one processor of the computing device cause the computing device to perform:
   adjusting the beam position by offsetting a magnetic field disturbance caused by the wafer stage movement at the third velocity.

49. The computer readable medium of any one of clause 41-48, wherein the set of instructions that is executable by at least one processor of the computing device cause the computing device to further perform:
   inspecting a wafer based on the adjusted beam position on the wafer while the wafer stage moves at the third velocity.

50. The computer readable medium of any one of clause 41-49, wherein the wafer stage includes a conductor.

51. A non-transitory computer readable medium that stores a set of instructions that is executable by at least on processor of a computing device to cause the computing device to perform a method for correcting inspection image, the method comprising
   acquiring first beam positions on a test wafer while a wafer stage supporting the test wafer is stationary;
   acquiring second beam positions on the test wafer while the wafer stage moves at a first velocity, the second beam positions corresponding to the first beam positions;
   determining position displacements of the second beam positions from the corresponding first beam positions; and
   adjusting a beam position of a beam for inspecting a wafer based on a target position of the beam on the wafer, a corresponding position displacement among the determined position displacements, and the first velocity.

52. The computer readable medium of clause 51, wherein the position displacements of the second beam positions include a first position displacement and a second position displacement, and the first position displacement is different from the second position displacement.

53. The computer readable medium of clause 51 or 52, wherein the set of instructions that is executable by at least one processor of the computing device cause the computing device to further perform:
   determining a beam displacement of the beam while the wafer stage moves at a second velocity that is different from the first velocity.

54. The computer readable medium of clause 53, wherein, in determining the beam displacement of the beam, wherein the set of instructions that is executable by at least one processor of the computing device cause the computing device to perform:
   determining the beam displacement of the beam based on the corresponding position displacement and a ratio of the second velocity to the first velocity.

55. The computer readable medium of clause 54, wherein, in adjusting the beam position, wherein the set of instructions that is executable by at least one processor of the computing device cause the computing device to perform:
   adjusting the beam position of the beam based on the beam displacement of the beam.

56. The computer readable medium of any one of clause 51-55, wherein, in adjusting the beam position, wherein the set of instructions that is executable by at least one processor of the computing device cause the computing device to perform:
   generating a control signal to adjust an operational parameter of a beam deflector.

57. The computer readable medium of any one of clause 51-56, wherein, in adjusting the beam position, wherein the set of instructions that is executable by at least one processor of the computing device cause the computing device to perform:
   generating a control signal to adjust a magnetic field of a beam inspection tool during operation.

58. The computer readable medium of any one of clause 53-55, wherein, in adjusting the beam position, wherein the set of instructions that is executable by at least one processor of the computing device cause the computing device to perform:
   adjusting the beam position by offsetting the determined beam displacement.

59. The computer readable medium of any one of clause 53-55, wherein, in adjusting the beam position, wherein the set of instructions that is executable by at least one processor of the computing device cause the computing device to perform:
   adjusting the beam position by offsetting a magnetic field disturbance caused by the wafer stage movement at the second velocity.

60. The computer readable medium of any one of clause 51-59, wherein the set of instructions that is executable by at least one processor of the computing device cause the computing device to further perform:
   inspecting the wafer based on the adjusted beam position on the wafer while the wafer stage moves at the second velocity.

Block diagrams in the figures may illustrate the architecture, functionality, and operation of possible implementations of systems, methods, and computer hardware or software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method for correcting inspection image error, comprising:
- acquiring a set of first beam positions on a test wafer while a wafer stage supporting the test wafer moves at a first velocity;
- acquiring a set of second beam positions, corresponding to the set of first beam positions, on the test wafer while the wafer stage moves at a second velocity;
- calculating a beam position displacement of a beam while the wafer stage moves at a third velocity in a range of velocities from the first velocity to the second velocity; and
- adjusting a beam position of the beam based on the calculated beam position displacement.

2. The method of claim 1, wherein the first velocity is zero.

3. The method of claim 1, wherein adjusting the beam position comprises:
- generating a control signal to adjust an operational parameter of a beam deflector.

4. The method of claim 1, wherein adjusting the beam position comprises:
- generating a control signal to adjust a magnetic field of a beam inspection tool during operation.

5. The method of claim 1, wherein adjusting the beam position comprises:
- adjusting the beam position based on a target position of the beam on a wafer, the first and second beam positions, the first and second velocities, and the third velocity.

6. The method of claim 1, wherein adjusting the beam position comprises:
- adjusting the beam position by offsetting the calculated beam position displacement.

7. The method of claim 1, wherein the beam position displacement is calculated based on a target position of the beam on a wafer, a first beam position among the set of first beam positions corresponding to the target position and a second beam position among the set of second beam positions corresponding to the target position, the first and second velocities, and the third velocity.

8. The method of claim 1, wherein adjusting the beam position comprises:
- adjusting the beam position by offsetting a magnetic field disturbance caused by the wafer stage movement at the third velocity.

9. The method of claim 1, further comprising:
- inspecting a wafer based on the adjusted beam position on the wafer while the wafer stage moves at the third velocity.

10. The method of claim 1, wherein the wafer stage includes a conductor.

11. An apparatus for correcting inspection image error, comprising:
- a memory storing a set of instructions; and
- at least one processor configured to execute the set of instructions to cause the apparatus to perform:
  - acquiring a set of first beam positions on a test wafer while a wafer stage supporting the test wafer moves at a first velocity;
  - acquiring a set of second beam positions, corresponding to the set of first beam positions, on the test wafer while the wafer stage moves at a second velocity;
- calculating a beam position displacement of a beam while the wafer stage moves at a third velocity in a range of velocities from the first velocity to the second velocity; and
  - adjusting a beam position of the beam based on the calculated beam position displacement.

12. The apparatus of claim 11, wherein, in adjusting the beam position, the at least one processor is configured to execute the set of instructions to cause the apparatus to perform:
- adjusting the beam position by offsetting the calculated beam position displacement.

13. The apparatus of claim 11, wherein the beam position displacement is calculated based on a target position of the beam on a wafer, a first beam position among the set of first beam positions corresponding to the target position and a second beam position among the set of second beam positions corresponding to the target position, the first and second velocities, and the third velocity.

14. The apparatus of claim 11, wherein, in adjusting the beam position, the at least one processor is configured to execute the set of instructions to cause the apparatus to perform:
- adjusting the beam position by offsetting a magnetic field disturbance caused by the wafer stage movement at the third velocity.

15. The apparatus of claim 11, wherein the at least one processor is configured to execute the set of instructions to cause the apparatus to further perform:
- inspecting a wafer based on the adjusted beam position on the wafer while the wafer stage moves at the third velocity.

16. A non-transitory computer readable medium that stores a set of instructions that is executable by at least one processor of a computing device to cause the computing device to perform operations for correcting inspection image, the operations comprising:
- acquiring a set of first beam positions on a test wafer while a wafer stage supporting the test wafer moves at a first velocity;
- acquiring a set of second beam positions, corresponding to the set of first beam positions, on the test wafer while the wafer stage moves at a second velocity;
- calculating a beam position displacement of a beam while the wafer stage moves at a third velocity in a range of velocities from the first velocity to the second velocity; and
- adjusting a beam position of the beam based on the calculated beam position displacement.

17. The computer readable medium of claim 16, wherein the first velocity is zero.

18. The computer readable medium of claim 16, wherein, in adjusting the beam position, the set of instructions that is executable by at least one processor of the computing device cause the computing device to perform operations comprising:
- generating a control signal to adjust an operational parameter of a beam deflector.

19. The computer readable medium of claim 16, wherein, in adjusting the beam position, the set of instructions that is executable by at least one processor of the computing device cause the computing device to perform operations comprising:

generating a control signal to adjust a magnetic field of a beam inspection tool during operation.

20. The computer readable medium of claim 16, wherein, in adjusting the beam position, the set of instructions that is executable by at least one processor of the computing device cause the computing device to perform operations comprising:

adjusting the beam position based on a target position of the beam on a wafer, the first and second beam positions, the first and second velocities, and the third velocity.

* * * * *